(12) United States Patent
Den Hartog et al.

(10) Patent No.: US 10,211,205 B2
(45) Date of Patent: Feb. 19, 2019

(54) FIELD EFFECT TRANSISTOR STRUCTURE FOR REDUCING CONTACT RESISTANCE

(71) Applicant: International Business Machines Corporation, Armonk, NY (US)

(72) Inventors: Brent R. Den Hartog, Rochester, MN (US); Eric J. Lukes, Stewartville, MN (US); Matthew J. Paschal, Rochester, MN (US); Nghia V. Phan, Rochester, MN (US); Raymond A. Richetta, Rochester, MN (US); Patrick L. Rosno, Rochester, MN (US); Timothy J. Schmerbeck, Mantorville, MN (US); Dereje G. Yilma, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 15/139,365

(22) Filed: Apr. 27, 2016

(65) Prior Publication Data
US 2017/0317082 A1 Nov. 2, 2017

(51) Int. Cl.
*H01L 27/092* (2006.01)
*H01L 27/02* (2006.01)
(Continued)

(52) U.S. Cl.
CPC ........ *H01L 27/092* (2013.01); *H01L 27/0207* (2013.01); *H01L 29/41725* (2013.01); *H01L 29/7816* (2013.01)

(58) Field of Classification Search
None
See application file for complete search history.

(56) References Cited

U.S. PATENT DOCUMENTS 8,680,610 B2 3/2014 Hsieh
8,866,260 B2 10/2014 Shieh et al.
(Continued)

FOREIGN PATENT DOCUMENTS

KR 101466846 B1 11/2014

OTHER PUBLICATIONS

Wang et al., "FinFET Resistance Mitigation through Design and Process Optimization," International Symposium on VLSI Technology, Systems, and Applications, Apr. 27-29, 2009, pp. 127-128, © 2009 IEEE ISBN: 978-1-4244-2785-7.
(Continued)

*Primary Examiner* — Mounir S Amer
(74) *Attorney, Agent, or Firm* — Peter J. Edwards

(57) ABSTRACT

A circuit component comprises a row of transistors. The row may contain a first active FET with a source region and a drain region. The row may also contain a first active dummy FET that shares the source region and that also has a diffusion region. The row may also contain a second active FET and a second active dummy FET, positioned such that the active dummy FETs are located between the active FETs on the row. The row may also have an end positioned such that the first active dummy FET is between the end and the first active FET. A supply of current may be electrically connected to the source diffusion regions. A load region may be electrically connected to the drain region. The first active FET and the first active dummy FET may have gates that share a voltage source or that have their own voltage source.

20 Claims, 3 Drawing Sheets

(51) Int. Cl.
*H01L 29/417* (2006.01)
*H01L 29/78* (2006.01)

(56) References Cited

U.S. PATENT DOCUMENTS

| | | |
|---|---|---|
| 8,869,085 B2 | 10/2014 | Lu |
| 2002/0017682 A1 | 2/2002 | Xu et al. |
| 2003/0070147 A1* | 4/2003 | Friend .................. G06F 17/505 716/103 |
| 2013/0172360 A1* | 7/2013 | Kaloun ................ C07D 471/04 514/249 |
| 2014/0109033 A1 | 4/2014 | Chern et al. |
| 2014/0239412 A1* | 8/2014 | Yang .................. H01L 27/0207 257/401 |
| 2014/0252429 A1 | 9/2014 | Richter et al. |
| 2015/0076569 A1 | 3/2015 | Hong et al. |
| 2015/0194496 A1 | 7/2015 | Basker et al. |
| 2015/0228649 A1 | 8/2015 | Singh et al. |
| 2015/0279840 A1 | 10/2015 | Huang et al. |
| 2017/0250277 A1* | 8/2017 | Wu ..................... H01L 29/7823 |

OTHER PUBLICATIONS

Coss et al., "Contact Resistance Reduction to FinFET Source/Drain Using Dielectric Dipole Mitigated Schottky Barrier Height Tuning," 2010 IEEE International Electron Device Meeting, Dec. 6-8, 2010, pp. 26.3.1-26.3.4, DOI: 10.1109/IEDM.2010.5703426.

Smith, C., "Advanced Technology for Source Drain Resistance Reduction in Nanoscale FinFETs," Dissertation Prepared for the Degree of Doctor of Philosophy, University of North Texas, May 2008, 139 pages.

* cited by examiner

FIELD EFFECT TRANSISTOR STRUCTURE FOR REDUCING CONTACT RESISTANCE

BACKGROUND

The present disclosure relates to semiconductor structures, and more specifically, to field effect transistors.

Typical circuit components utilizing field effect transistors (FETs) utilize conductive contacts that overlap diffusion regions to conduct current to and from the FET. The size of these conductive contacts is often limited by lithographic constraints of the technology node in which the circuit is implemented and design constraints of the larger circuit into which the circuit component is implemented. The limited size of conductive contacts may increase the resistance across those contacts, limiting the performance of the circuit.

SUMMARY

Some embodiments of the present disclosure can be illustrated by a circuit component that may comprise a row of transistors. The row may comprise a first active field effect transistor (FET) that has a first gate, a first drain region, a first source region, and a first channel that is located between the first drain region and the first source region. The row may comprise a first active dummy FET that has a second gate, the first source region, a first diffusion region, and a second channel that is located between the first source region and the first diffusion region.

The circuit component may also comprise a supply of current that is electrically connected to the first and second source regions and to the first and second diffusion regions. The circuit component may also comprise a load region that is electrically connected to the first and second drain regions. Finally, the circuit component may also comprise a first voltage source that is electrically connected to the first and third gates and a second voltage source that is electrically connected to the second and fourth gates.

Some embodiments of the present disclosure can also be illustrated by a circuit component comprising a row of transistors with a first end. The row may comprise a first active FET that has a first gate, a first drain region, a first source region, and a first channel located between the first drain region and the first source region. The first active FET may be positioned such that no second active FET is located in the row between the first active FET and the first end. The row may also comprise at least a first active dummy FET that has a second gate, the first source region, and a first diffusion region. The first active dummy FET may be positioned adjacent to the first active FET and between the first active FET and the first end of the row.

The circuit component may also comprise a supply of current that is electrically to the first source region and the first diffusion region. The circuit component may also comprise a load region that is electrically connected to the first drain region. Finally, the circuit component may comprise a first voltage source electrically connected to the first gate, and a second voltage source electrically connected to the second gate.

Some embodiments of the present disclosure can be illustrated by a design structure tangibly embodied in a machine readable medium for designing, manufacturing, or testing an integrated circuit that comprises a row of transistors. The row may comprise a first active FET that has a first gate, a first drain region, a first source region, and a first channel located between the first drain region and the first source region. The row may comprise a first active dummy FET that has a second gate, the first source region, a first diffusion region, and a second channel that is located between the first source region and the first diffusion region.

The first active dummy FET may be located between the first active FET and a second active FET in the row. The second active FET may have a third gate, a second source region, a second drain region, and a third channel located between the second source region and the second drain region. The second active FET may be positioned such that no active FETs are located in the row between the first active FET and the second active FET. The row may also comprise a second active dummy FET that has a fourth gate, the second source region, a second diffusion region, and a fourth channel located between the second source region and the second diffusion region. The second active dummy FET may be located between the first active FET and the second active FET.

The design structure may also comprise a supply of current that is electrically connected to the first and second source regions and to the first and second diffusion regions. The design structure may also comprise a load region that is electrically connected to the first and second drain regions. Finally, the design structure may also comprise a first voltage source that is electrically connected to the first and third gates and a second voltage source that is electrically connected to the second and fourth gates.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
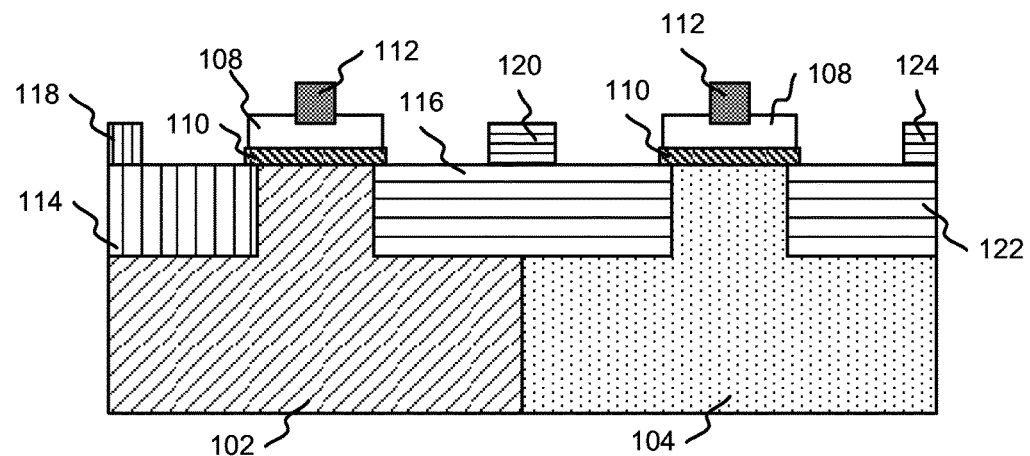
FIG. 1 depicts a cross-sectional diagram of two series-connected FETs that may be configured as an active FET and an active dummy FET, in accordance with embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to semiconductor structures, more particular aspects relate to field effect transistors. While the present disclosure is not necessarily limited to such applications, various aspects of the disclosure may be appreciated through a discussion of various examples using this context.

It is a continuing trend in electronics for electronic devices (e.g., personal computers, consumer electronics, electronics for industrial applications) to become smaller. This has been made possible, in part, by the shrinking of circuit boards and the circuits thereon. However, as the space taken up by circuits decreases, the components that make up those circuits have been required to shrink as well. In some instance the shrinking of those components has led to unwanted side effects.

For example, as electronic devices have decreased in size, the size of the transistors inside those electronic devices have been reduced as well. The reduction in size of those transistors oftentimes requires the reduction in size of the components that make up those transistors. Field effect transistors (FETs), for example, typically are electrically connected to other portions of a circuit by means of source and drain contacts. As FETs have shrunk, the FET source and drain diffusion regions that these contacts overlap have shrunk, and contact size has decreased accordingly. Unfortunately, as the total contact interface area (e.g., the faces of a contact metal that are touching a diffusion region) decreases, the resistance of the contact increases. This increase in contact resistance at the source and drain regions of FETs causes, in some applications, affected FETs to have reduced switching speed, because the resistance oftentimes limits the current supplied to the FET through the source contacts. Thus, the decrease in FET size has resulted in decreased performance.

Unfortunately, decreasing the resistance of FET source and drain contacts by increasing the contact size may cause other, unwanted side effects. For example, increasing the size of a contact at the source or drain diffusion region may cause the contact to extend beyond the diffusion region and into the semiconductor substrate of the FET. The contact extending to the semiconductor substrate may cause a current leakage, resulting in the FET wasting power, performing slower than expected, or not performing at all.

Further, decreasing the resistance of FET source and drain contacts by increasing the number of contacts in a single source or drain diffusion region is infeasible in many applications. While such a practice may increase the total contact interface area for the diffusion region as a whole, constraints in the lithographic manufacturing process oftentimes set a minimum component size. These constraints prevent solutions that involve shrinking contacts in order to fit multiple smaller contacts in one diffusion region rather than a single standard-size contact. Further, constraints on component patterns often require the distance (e.g., photolithic patterned pitch) between components to be constant throughout an entire circuit. Because of these lithographic constraints, increasing the size of a specific diffusion region to permit arrayed contacts in that diffusion region is oftentimes not possible. Further, increasing all diffusion regions throughout an entire circuit, while potentially allowing for sufficient total contact interface area (e.g., with arrayed contacts or large contacts), would typically cause the circuit to be too large.

Other efforts to solve the contact-resistance issues have been pursued, such as altering the material composition of FET contacts in order to reduce parasitic resistance of the material, and thinning device silicon layers in order to avoid short-channel effects of larger contacts. However, these efforts also have not been met with sufficient success. Thus, further solutions to reduce contact resistance in FETs are needed.

Some embodiments of the present disclosure may reduce contact resistance by increasing the number of contacts incorporated into FET designs. By designing FETs to take advantage of previously unutilized contacts or by adding contacts into FET designs to decrease the resistance between present components, contact resistance may be decreased within the constraints of circuit design, such as component size (e.g., the surface area of diffusion regions) and gate pitch (i.e., the distance between the polysilicon gates that activate or deactivate FETs).

Some embodiments of the present disclosure may decrease the resistance of the contacts used to connect the source diffusion regions to the supply of current for the FETs. These contacts are referred to herein as "source contacts." An "nFET" may utilize a supply of electrons, such as "ground," for current, whereas a "pFET" may utilize a supply of electron "holes" (i.e., a positive charge indicating an absence of an electron), such as a power-supply pin or rail, for current. Electrons and electron holes are referred to herein as "majority carriers" for their respective FETs. As used herein, majority carriers may also be referred to as "current." Thus, an embodiment that decreases the resistance of the source contacts of an nFET may decrease the resistance between the nFET and ground, whereas an embodiment that decreases the resistance of the source contacts of a pFET may decrease the resistance between the pFET and a DC voltage source. This is referred to as decreasing the source resistance for the FET.

Some embodiments of the present disclosure may also decrease the resistance of the contacts used to connect the drain diffusion regions to the "load region" (e.g., circuitry logic that the output of a FET affects, such as additional transistors, complementary FETs, or other components of the circuit). Decreasing the resistance at this connection is referred to as decreasing the drain resistance for the FET. This resistance is a component part RC time constant (essentially, the speed at which the circuit switches) for the FET and circuit load. Thus, in some instances decreasing this resistance may decrease the time it takes for a FET switching states (e.g., the channel in the FET changing from conducting to non-conducting or non-conducting to conducting) to affect the circuit's load region. In some embodiments, however, this may also increase the capacitance at the FET's drain contacts, and thus, the load region to which the drain contacts are electrically connected. This capacitance may slow the speed at which the load portion of the circuit may switch states. Thus, for the purposes of simplicity, most embodiments discussed herein refer to decreasing source resistance of a FET or multiple FETs. Some such embodiments may also be utilized to decrease drain resistance, but the resistance-reduction advantages of such applications may need to be compared to potential capacitance-increase disadvantages.

Some embodiments may decrease the source or drain resistance by incorporating both active and active dummy FETs into a design for a circuit component. Active FETs may be used for normal circuit purposes. Typically their gates can be turned on and off dynamically and drain-to-source connections are not usually shorted. As used herein, "active" may also be used to describe FETs whose gates are connected to a source of voltage that provide persistent power (e.g., "always" on gates and FETs that are turned on statically). Dummy FETs may have their drain-to-source connections shorted together, or they may have one of the drain or source contacts disconnected or open. Dummy devices that can be turned on (channel is formed and conducting) either statically or dynamically are referred to herein as active dummy FETs.

FIG. 1 illustrates potential differences between active and active dummy FETs in some embodiments. FIG. 1 depicts FETs 102 and 104, each of which contain a Gate 108 separated from the FET substrate, diffusion regions and channel (the portion of the FET substrate between the diffusion regions) by Insulating Layer 110. Each of FETs 102 and 104 also contain a Gate Contact 112 that connects that FET's gate to a source of voltage by which the gate may be driven and the respective FET switched (i.e., the FET's channel conducting or non-conducting).

FET 102 utilizes Diffusion Regions 114 and 116. Diffusion Contact 118 overlaps Diffusion Region 114, and is connected to the load region of the circuit (the portion of the circuit that is affected by the output of FET 102). Thus, Diffusion Contact 118 functions as a drain contact and Diffusion Region 114 functions as a drain region. Diffusion Contact 118 is depicted as a full-size contact to illustrate the potential for the inclusion of further FETs. Diffusion Contact 120 overlaps Diffusion Region 116, and is connected to a supply of current (either electrons or electron holes). Thus, Diffusion Contact 120 functions as a source contact and Diffusion Region 116 functions as a source region. Because the two diffusion regions adjacent FET 102's channel are of opposite connections (i.e., one is a source region and one is a drain region) and because FET 102's gate is connected to a source of voltage through a gate contact, FET 102 will switch states when the source of voltage driving the gate switches. This makes FET 102 an active FET.

FET 104 utilizes Diffusion Regions 116 and 122. Diffusion Contact 124 overlaps Diffusion Region 122, and is, like Diffusion Contact 120, connected to a supply of current (either electrons or electron holes). Diffusion Contact 124 is also depicted as a full-size contact to illustrate the potential for the inclusion of further FETs. This makes Diffusion Contact 124, like Diffusion Contact 120, a source contact and Diffusion Region 122, like Diffusion Region 116, a source region. Because the two diffusion regions adjacent FET 104's channel are both of the same connection, any current flow through FET 104's channel when FET 104's gate switches voltage will not, by itself, amount to a switch in state for the circuit; FET 104's output is the same as FET 104's input. In this case, they are both source contacts, but the same principle would apply if they were both drain contacts. This makes FET 104 an active dummy FET.

Figure 2A:
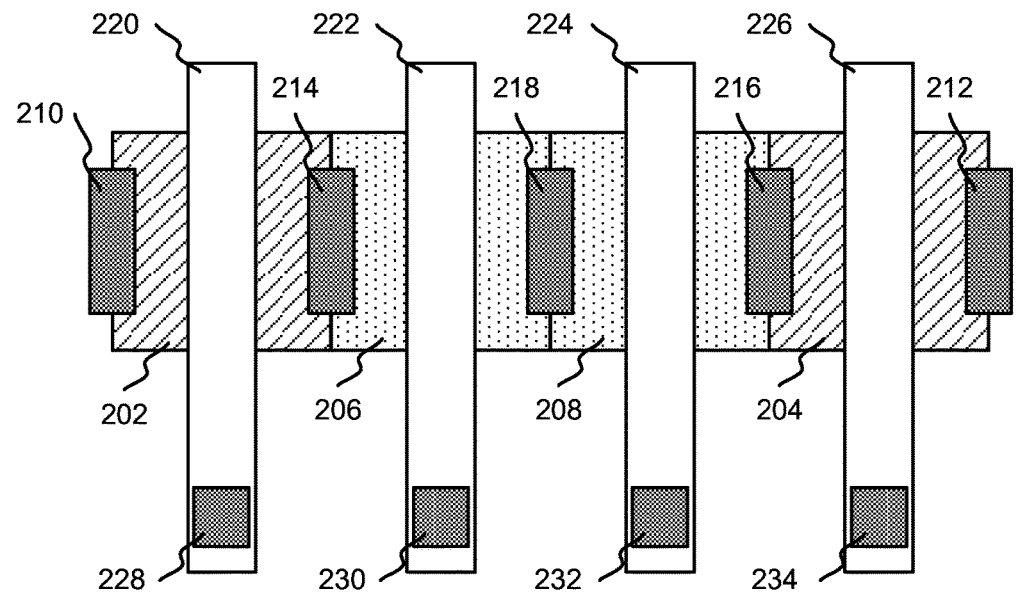
FIG. 2A depicts a layout view of four series-connected FETs that may be configured as two active dummy FETs between two active FETs, in accordance with embodiments.

One embodiment of the present disclosure may decrease the source resistance of active FETs of a circuit component in part by incorporating active dummy FETs between active FETs. FIG. 2A illustrates a layout of a design of such an embodiment. FIG. 2A contains Active FETs 202 and 204 and active dummy FETs 206 and 208. Drain Contact 210 partially overlaps the drain region of Active FET 202, and Drain Contact 212 partially overlaps the drain region of Active FET 204. Source Contact 214 partially overlaps each of the shared source region of Active FET 202 and Active Dummy FET 206 (i.e., the source region that is shared by the two FETs). Source Contact 216 partially overlaps each of the shared source regions of Active FET 204 and Active Dummy FET 208. Source Contact 218 partially overlaps the shared diffusion region of Active Dummy FET 206 and Active Dummy FET 208.

Each of FETs 202-208 has one of Gates 220-226. One of Gate Contacts 228-234 is connected to each gate, connecting each gate to a voltage source. Thus, in this embodiment, when the voltage source driving the gates is switched, the channel of each of FETs 202-208 will become conducting or non-conducting.

Because, in this embodiment, all contacts electrically connected to FETs 206 and 208 are source contacts, FETs 206 and 208 are dummy devices, and are not connected to the load region of the circuit. However, if the channels of both FETs 206 and 208 are conducting when the channels of FETs 202 and 204 also are conducting, the current flowing through Source Contact 218 may flow through the channels of FETs 206 and 208 and into the source regions of FETs 202 and 204. Thus, when FETs 202 and 204 are switched to conducting, they would be able to draw current from all three source contacts 214, 216, and 218.

In some embodiments, this may increase the source-contact total contact interface area by 3 times compared to embodiments using no active dummy FETs between two active FETs (i.e., embodiments in which two adjacent active FETs share one source contact), and by 1.5 times as compared to embodiments using one dummy FET between two active FETs (e.g., when a dummy FET is inserted between two active FETs to prevent overheating issues). This increase in source-contact total contact interface area may be accompanied by a corresponding drop in source resistance across the circuit component, allowing current to flow to Active FETs 202 and 204 faster, allowing, in turn, faster switching of those FETs and, therefore faster circuit performance.

In some embodiments each of Gate Contacts 228-234 may be electrically connected to the same source of power, causing each of Gates 220-226 to switch on and off together. However, because Active Dummy FETs 206 and 208 are not connected to the load portion of the circuit, it may be beneficial in some embodiments for Gates 220 and 222 to remain on in their default state (e.g., Gates 220 and 222 may be connected to a positive supply voltage, such as Vdd). This may lead to faster performance of Active Dummy FETs 206 and 208 when Gates 220 and 222 are switched on, as the channels of Active Dummy FETs 206 and 208 would be in an open state by default, and thus would be ready to carry current immediately when a circuit is completed by opening the channels of Active FETs 202 and 204.

Further, in embodiments in which the Gates 222 and 224 are powered in their default state, Gates 222 and 224, together with Source Contacts 214, 216, and 218, may provide supply-to-ground decoupling capacitance. Because Gates 222 and 224 are charged by their voltage source, Source Contacts 214-218 are charged by the supply of current, and the gates and contacts are electrically separated by an insulator, each gate-contact pair (e.g., Gate 222 and Source Contact 214, Gate 222 and Source Contact 218, and Gate 224 and Source Contact 218) acts as a capacitor. These capacitors help to separate the connected portions of the circuit (e.g., the power supply) from noise caused by current and voltage changes by other devices in the circuit, effectively providing a source of decoupling capacitance.

Figure 2B:
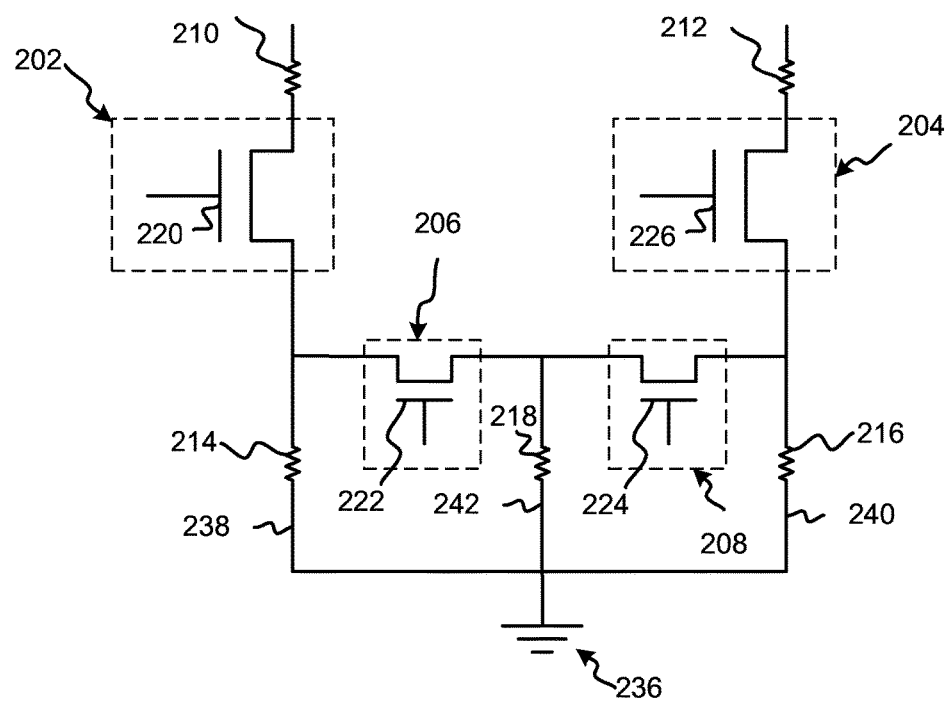
FIG. 2B depicts a circuit-schematic view of four series-connected FETs that may be configured as two active dummy FETs between two active FETs, in accordance with embodiments.

For ease of understanding, FIG. 2B depicts one possible circuit schematic representation of the layout presented in FIG. 2A. Active FET 202 connects to Drain Contact 210, through which Active FET 202 may be electrically connected to a load portion of the circuit. Similarly, Active FET 204 connects to Drain Contact 212, through which it may be electrically connected to a load portion of the circuit. Active FET 202 also connects to Source Contact 214, through which it may be electrically connected to a supply of current. Here, that supply of current is represented by Ground 236, and the connection is also through Wire 238. Active FET 204 also connects to Source Contact 216. It is through Source Contact 216 (and through Wire 240) that Active FET 204 may be electrically connected to Ground 236. Active Dummy FET 206, as depicted, shares Source Contact 214 with Active FET 202, and also shares the diffusion region into which Source Contact 214 is connected (here, a source region) with Active FET 202. Similarly, Active Dummy FET 208 shares Source Contact 216, and the source region into which Source Contact 216 is connected, with Active FET 204. Active Dummy FETs 206 and 208 share Source Contact 218, and the diffusion region into which it is connected, with each other. Through Source Contact 218, Active Dummy FETs 206 and 208 have an added electrical coupling to Ground 236 through Wire 242.

In the embodiment depicted, when voltage at each of Gates 220-226 is brought to a higher voltage than the source voltage (here, the voltage of Ground 236 and connected wires and contacts), the channels of Active FETs 202 and 204 and Active Dummy FETs 206 and 208, provided they are n-channel FETs, will become conducting (note that, in some embodiments, Gates 222 and 224 may be connected to Vdd, and thus the channels of Dummy FETs 206 and 208 may already be conducting). When the channels of the FETs become conducting, electrons may flow from Ground 236 through Wire 238 and Source Contact 214 into the source region shared by Active FET 202 and Active Dummy FET 206. From that source region the electrons may flow across the conducting channel of Active FET 202 to the drain region, and into the load region of the circuit through Drain Contact 210. A similar flow may also be observed from Ground 236, through Wire 240, Source Contact 216, Active FET 204, and Drain Contact 212.

Additionally, electrons may also flow through from Ground 236, through Wire 242 and to Source Contact 218. Because the channels of Active Dummy FETs 206 and 208 are both conducting, electrons may flow through the channel of either FET. For example, electrons may flow from Source Contact 218, through the diffusion region shared by Active Dummy FETs 206 and 208, through Active Dummy FET 206's channel and to the source region shared by Active Dummy FET 206 and Active FET 202. From that source region the electrons may flow through Active FET 202's channel in the same way that electrons that reached the source region through Wire 238 and Source Contact 214 were able to. A similar flow may also be observed from Source Contact 218 through Active Dummy FET 208, Active FET 204, and Drain Contact 212.

As the above example illustrates, incorporating two active dummy FETs between two active FETs may provide added wires and contacts through which current may flow. These wires and contacts, when added in parallel, may increase the total contact interface area of the source circuitry, thereby decreasing the source resistance. This advantage is illustrated by the resistor symbols on Wires 238, 242, and 240, and beyond Drain Contacts 210 and 212. These resistor symbols represent the resistance of the contacts, wires, and other components that couple the electrical components of the circuit (e.g., Ground 236 to Active FET 202). In this embodiment, the electrical components coupling Ground 236 to the diffusion regions that Source Contacts 214, 216, and 218 overlap provide parallel resistance between Ground 236 and Active FETs 202 and 204, lowering the resistance of each path. As an added benefit, the additional gates, in some embodiments, may also effectively contribute decoupling capacitance to the circuit.

It will be appreciated by one of skill in the art that alterations to the embodiment presented in connection with FIG. 2A and FIG. 2B may achieve similar results without departing from the scope and spirit of the disclosure. For example, in some embodiments more than two active dummy FETs may be placed between two active FETs. These embodiments may allow for more source contacts to be inserted between the two active FETs, further decreasing the source contact resistance. In these or other embodiments, one or more gates associated with one or more active dummy FETs may not be connected to a source of voltage. For example, if the gate associated with Active Dummy FET 208 were not connected to a source of voltage by a gate contact, electrons may still be able to flow from Ground 236 through Source Contact 218 and through Active Dummy FET 206's conducting channel.

It will be further appreciated by one of skill in the art that, while FIG. 2B and the associated discussion presents Active FETs 202 and 204 and Active Dummy FETs 206 and 208 as enhancement mode, n-type FETs, other types of FETs are possible. For example, a similar embodiment may utilize depletion-mode FETs, in which case the channels would become conducting when the difference between the voltages of gates and source is brought to zero. Further, p-type FETs may also be used, in which case, in enhancement mode, the channels would become conducting when the voltage of the gates is brought to a lower voltage than the source voltage.

Figure 3:
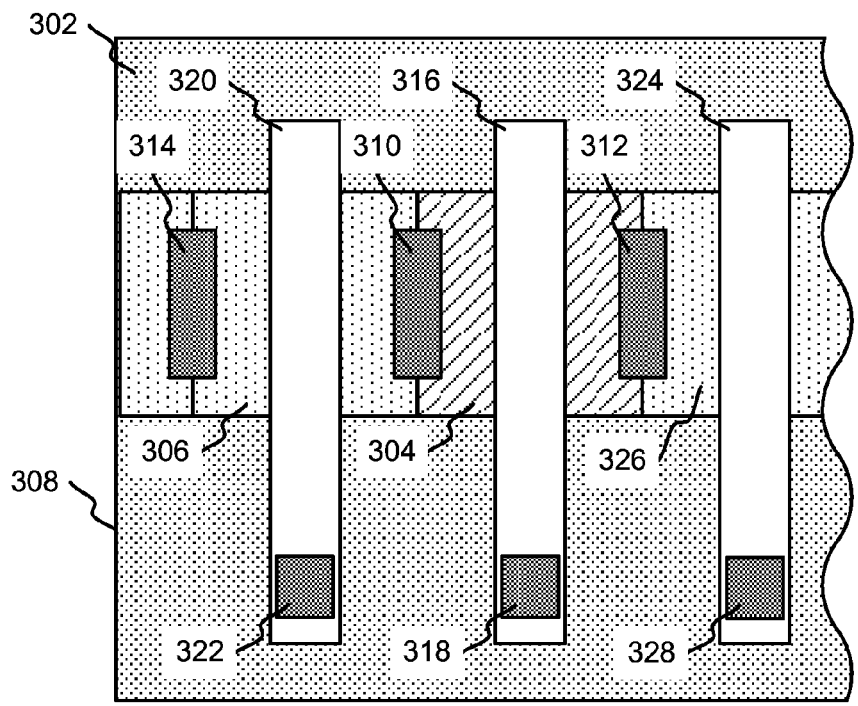
FIG. 3 depicts a layout view of two series-connected FETs at the left edge of a row of FETs that may be configured as an active FET and an active dummy FET, in accordance with embodiments.

Some embodiments of the present disclosure may be utilized at the last transistor in a group of transistors (e.g., near the point at which an insulating layer, such as an oxide layer, terminates, or near the edge of a p-type or n-type substrate well). FIG. 3 illustrates a layout of a design utilizing an active dummy FET outside the last active FET. Active FET 304 is located adjacent to Active Dummy FET 306, the last FET before Edge 308 of Oxide Layer 302. Active FET 304, shares a diffusion region with Active Dummy FET 306, which Contact 310 will partially overlap. Contact 312 may partially overlap the diffusion region on the other side of Active FET 304's channel. In some embodiments Contact 314 may be added to the design. Contacts 310 and 314 may be source contacts, and Contact 312 may be a drain contact. Thus, Active Dummy FET 306 and Active FET 304 may be electrically connected to a supply of current through Contacts 314 and 310.

Active FET 312 may have Gate 316, which may be electrically connected to a voltage source through Gate Contact 318. Active Dummy FET 306 may have Gate 320, which may be electrically connected to the same voltage source through Gate Contact 322. Thus, if that voltage source switched (e.g., dropped below the source voltage in an enhancement-type, p-type FET), the channels of Active FET 304 and Active Dummy FET 306 would open, allowing electron holes (in a p-type FET) to flow from a source (e.g., a power-supply rail) to Contacts 310 and 314, and from Contacts 310 and 314, through the channels of Active FET 304 and Active Dummy FET 306. The electron holes may then arrive at the drain region of Active FET 304, flow through Contact 312, and to a load region to which Contact 312 has been electrically connected. By incorporating Active Dummy FET 306 and Contact 314, the source-contact total contact area increases, reducing source-contact resistance. Further, because Gate 320 may be powered in its default state (e.g., Gate Contact 322 may be electrically connected to Vdd), it may provide decoupling capacitance, which may help to stabilize the supply of current.

In some embodiments further FETs and associated gates may be located in board (i.e., away from the edge of Edge 308) of Active FET 304. In this illustration this has been depicted as Active Dummy FET 326 associated with Gate 324 and Gate Contact 328, at which point the illustration is cut off to signify that the row of FET devices may continue. However, in some other embodiments a further active FET may be adjacent to and inboard of Active FET 304. In other embodiments the row of FETs may terminate at Active FET 304.

Further, in FIG. 3, part of an Active Dummy FET is depicted between Active Dummy FET 306 and Edge 308. This partial FET is meant to clarify that, in some embodiments, the source region into which Contact 314 is partially overlapping may be a standard-size diffusion region, and may extend past the "boundary" of Active Dummy FET 306. In other embodiments, the source region into which Contact 314 is overlapping may be a partial-size diffusion region, in which case the source region may only extend to the edge of the boundary of Active Dummy FET 306.

Figure 4:
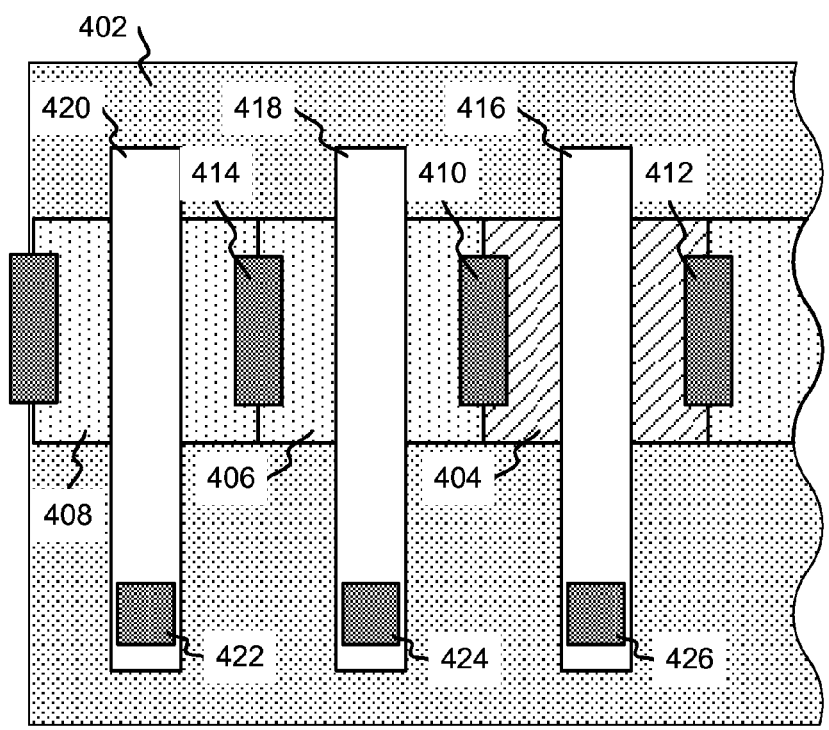
FIG. 4 depicts a layout view of three-series connected FETs at the left edge of a row of FETs that may be configured as an active FET and two active dummy FETs, in accordance with embodiments.

In other embodiments, a second Active Dummy FET may be between an Active Dummy FET and the edge of a transmitting region (e.g., the edge of an insulating layer or the edge of a substrate well). Such an embodiment is illustrated in FIG. 4. FIG. 4 depicts a transmission region 402, near the edge of which Active FET 404 and Active Dummy FETs 406 and 408 are formed. Contacts 410 and 414 may be source contacts and Contact 412 may be a drain contact. Active FET 404 and Active Dummy FETs 406 and 408 have Gates 416, 418, and 420 respectively. Each of Gates 416, 418, and 420 are electrically connected to a source of potential by Gate Contacts 422-426. Thus, current may flow through Active FET 404, Active Dummy FET 406, and Contacts 410-414 in a similar way as that presented by FIG. 3.

Active Dummy FET 408, as presented, does not have a second contact on the side of its channel that is opposite Contact 414. Thus, current would not flow through Active Dummy FET 408 in this embodiment. However, Gate 420 would contribute decoupling capacitance between Contact 414 and Gate Contact 422 when the gate is connected to a constant supply of voltage (e.g., Vdd). This may help to stabilize the voltage of the circuit to which Contacts 410 and 414 and Gates 418 and 416 are electrically connected. In some embodiments this may be a supply of current, whereas in other embodiments it may be a load region of the circuit.

In some embodiments, a second contact may be added to Active Dummy FET 408 on the side of its channel that is opposite Contact 414. Provided that the second contact and Contact 414 are electrically connected to the same component (e.g., source or drain), Active Dummy FET 408 would remain an active dummy FET. In such an embodiment, the added contact may further reduce resistance.

In some embodiments, either of the circuit-component layouts may be installed in several of the rows of transistors that are connected to a supply of current. In some such embodiments, every row of transistors may have such a circuit-component layout located at each end of the row. In these embodiments, the benefit derived from the decoupling-capacitance effect would increase with each addition of a gate connected between a supply and ground. For supplies of current that are connected to many rows of transistors (e.g., a power supply that is connected to many alternating rows of n-FET and p-FET transistors, each row with its own substrate well), the aggregate decoupling capacitance on the supply may be substantial, and is attainable without sacrificing surface area of the circuit.

FIGS. 1, 2A, 3, and 4 present embodiments by depicting single-gate FETs, such as metal-oxide-semiconductor FETs (MOSFETs) for illustrative purposes. However, it will be appreciated by one of skill in the art that some embodiments of the present disclosure may also utilize multi-gate FETs, such as FinFETs, without departing from the scope and spirit of the described embodiments.

In some embodiments each diffusion region in a row may be the same size as, or of a substantially similar size to, every other diffusion region in the row. In other embodiments some diffusion regions may be smaller than others (e.g., a diffusion region at the end of a row of FETs may be a partial diffusion region).

The descriptions of some embodiments of this disclosure discuss some components being electrically connected to others. As used herein, "electrically connected" refers to a connection designed or incorporated to allow current (i.e., a flow of electrons) to pass from one such component to another. Thus, two components that are "electrically connected" may be immediately adjacent to each other (e.g., a diffusion region may be electrically connected to a contact embedded into that diffusion region), or the two components may be separated by intervening passive components (e.g., a source contact may be connected to a source of ground through one or more metal wires, and potentially other contacts or components). As used herein, electrically connected does not refer to components in the same row separated by intervening active components that may be switched between conducting and non-conducting (e.g., a source region and drain region separated by the channel of an active FET).

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A circuit component comprising:
   a row of transistors;
   a first active field effect transistor (FET) in the row, the first active FET having a first gate, a first drain region, a first source region, and a first channel located between the first drain region and the first source region;
   a first active dummy FET in the row, the first active dummy FET having a second gate, the first source region, a first diffusion region, and a second channel located between the first source region and the first diffusion region, the first active dummy FET being located between the first active FET and a second active FET in the row;
   the second active FET having a third gate, a second source region, a second drain region, and a third channel located between the second source region and the second drain region, wherein no active FETs are located in the row between the first active FET and the second active FET;
   a second active dummy FET in the row, the second active dummy FET having a fourth gate, the second source region, a second diffusion region, and a fourth channel located between the second source region and the second diffusion region, and being located in the row between the first active FET and the second active FET;

a supply of current electrically connected to the first and second source regions and the first and second diffusion regions;

a load region electrically connected to the first and second drain regions;

a first voltage source electrically connected to the first and third gates; and a second voltage source electrically connected to the second and fourth gates.

2. Claim 1, wherein the second voltage source is a positive supply voltage.

3. Claim 1, wherein the second and fourth gates are powered in their default state.

4. Claim 1, wherein the first voltage source and the second voltage source are the same voltage source.

5. Claim 1, wherein first diffusion region and the second diffusion region are the same diffusion region.

6. Claim 1, further comprising a third active dummy FET, the third active dummy FET having a fifth gate, the first diffusion region, and a third diffusion region, the fifth gate being electrically connected to the second voltage source.

7. Claim 1, wherein at least one of the group consisting of: the first active FET, the second active FET, the first active dummy FET, and the second active dummy FET are MOSFETs.

8. Claim 1, wherein at least one of the group consisting of: the first active FET, the second active FET, the first active dummy FET, and the second active dummy FET are FinFETs.

9. A circuit component comprising:
a row of transistors with a first end;
a first active FET in the row, the first active FET having a first gate, a first drain region, a first source region, and a first channel located between the first drain region and the first source region, wherein no second active FET is located in the row between the first active FET and the first end;
a first active dummy FET in the row, the first active dummy FET having a second gate, the first source region, a first diffusion region, and a second channel located between the first source region and a first diffusion region, wherein the first active dummy FET is located in the row adjacent to the first active FET and between the first active FET and the first end;
a supply of current electrically connected to the first source region and the first diffusion region;
a load region electrically connected to the first drain region;
a first voltage source electrically connected to the first gate; and
a second voltage source electrically connected to the second gate.

10. The circuit component of claim 9, wherein no second active dummy FET is located in the row between the first active FET and the first end.

11. The circuit component of claim 9, wherein a second active dummy FET having a third gate is located in the row between the first active FET and the first end, wherein the second voltage source is electrically connected to the third gate.

12. The circuit component of claim 9, wherein the first end is the edge of an oxide insulating layer.

13. The circuit component of claim 9, wherein the first end is the edge of a substrate well.

14. The circuit component of claim 9, further comprising a second row of transistors with a second end;

a second active FET in the second row, the second active FET having a fourth gate, a second drain region, a second source region, and a fourth channel located between the second drain region and the second source region, wherein no third active FET is located in the row between the second active FET and the second end;

a third active dummy FET in the second row, the third active dummy FET having a fifth gate, the second source region, a second diffusion region, and a fifth channel located between the second source region and a second diffusion region, wherein the third active dummy FET is located in the second row adjacent to the second active FET and between the second active FET and the second end;

the supply of current electrically connected to the second source region and the second diffusion region;

a second load region electrically connected to the second drain region; and a second voltage source electrically connected to the fourth and fifth gates.

15. The circuit component of claim 14, wherein the first row of FETs and the second row of FETs are complementary.

16. A design structure tangibly embodied in a not-transitory machine readable medium for designing, manufacturing, or testing an integrated circuit, the design structure comprising:

a row of transistors;

a first active field effect transistor (FET) in the row, the first active FET having a first gate, a first drain region, a first source region, and a first channel located between the first drain region and the first source region;

a first active dummy FET in the row, the first active dummy FET having a second gate, the first source region, and a first diffusion region, and a second channel located between the first source region and the first diffusion region, the first active dummy FET being located between the first active FET and a second active FET in the row;

the second active FET having a third gate, a second source region, a second drain region and a third channel located between the second source region and the second drain region, wherein no active FETs are located in the row between the first active FET and the second active FET;

a second active dummy FET in the row, the second active dummy FET having a fourth gate, the second source region, a second diffusion region and a fourth channel located between the second source region and the second diffusion region, and being located in the row between the first active FET and the second active FET;

a supply of current electrically connected to the first and second source regions and the first and second diffusion regions;

a load region electrically connected to the first and second drain regions;

a first voltage source electrically connected to the first and third gates; and a second voltage source electrically connected to the second and fourth gates.

17. Claim 16, wherein first diffusion region and the second diffusion region are the same diffusion region.

18. Claim 16, further comprising a third active dummy FET, the third active dummy FET having a fifth gate, the first diffusion region, and a third diffusion region, the fifth gate being electrically connected to the second voltage source.

19. Claim 16, wherein at least one of the group consisting of: the first active FET, the second active FET, the first active dummy FET, and the second active dummy FET are MOSFETs.

20. Claim 16, wherein at least one of the group consisting of: the first active FET, the second active FET, the first active dummy FET, and the second active dummy FET are FinFETs.

\* \* \* \* \*